(12) United States Patent
Dumitru et al.

(10) Patent No.: US 8,222,916 B2
(45) Date of Patent: Jul. 17, 2012

(54) SINGLE EVENT TRANSIENT DIRECT MEASUREMENT METHODOLOGY AND CIRCUIT

(75) Inventors: Radu Dumitru, Colorado Springs, CO (US); Harry Gardner, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 0 days.

(21) Appl. No.: 12/948,004

(22) Filed: Nov. 17, 2010

(65) Prior Publication Data

US 2012/0119780 A1    May 17, 2012

(51) Int. Cl.
*H03K 19/00*    (2006.01)
(52) U.S. Cl. .......................................... 326/16
(58) Field of Classification Search ................ 326/9–13, 326/16, 35–36, 93–96, 104, 114
See application file for complete search history.

(56) References Cited

U.S. PATENT DOCUMENTS

| | | | |
|---|---|---|---|
| 6,438,178 B1* | 8/2002 | Lysdal et al. .................. | 375/317 |
| 6,661,262 B1* | 12/2003 | Curran ............................ | 327/116 |
| 7,023,235 B2* | 4/2006 | Hoff ................................ | 326/10 |
| 7,557,643 B2* | 7/2009 | Jin et al. ........................ | 327/551 |
| 2003/0234670 A1* | 12/2003 | Curran ............................ | 327/122 |
| 2005/0110472 A1* | 5/2005 | Harris et al. ................... | 323/271 |
| 2006/0132110 A1* | 6/2006 | Tang ............................... | 323/282 |
| 2008/0141088 A1* | 6/2008 | Parulkar et al. ............... | 714/729 |
| 2008/0164909 A1* | 7/2008 | Jin et al. ......................... | 326/46 |
| 2009/0002083 A1* | 1/2009 | Takahashi et al. ............. | 331/1 A |
| 2009/0003096 A1* | 1/2009 | Kim et al. ....................... | 365/194 |
| 2009/0039919 A1* | 2/2009 | Verbauwhede et al. ........ | 326/46 |
| 2011/0291727 A1* | 12/2011 | Kim ................................ | 327/237 |

* cited by examiner

*Primary Examiner* — Shawki S Ismail
*Assistant Examiner* — Thienvu Tran
(74) *Attorney, Agent, or Firm* — William J. Kubida; Peter J. Meza; Hogan Lovells US LLP

(57) ABSTRACT

A circuit and method of directly measuring the Single Event Transient (SET) performance of a combinatorial circuit includes a measurement chain. The measurement chain includes a plurality of cells, each in turn including a pair of SR latches, a dual-input inverter, and a target. During measurement and testing, the targets are irradiated, and a pulse signal caused by an SET event is allowed to propagate through the measurement chain only if the pair of SR latches are active at the same time. The pulse signal is latched by the measurement chain, thus allowing the presence of an SET event to be detected.

16 Claims, 7 Drawing Sheets

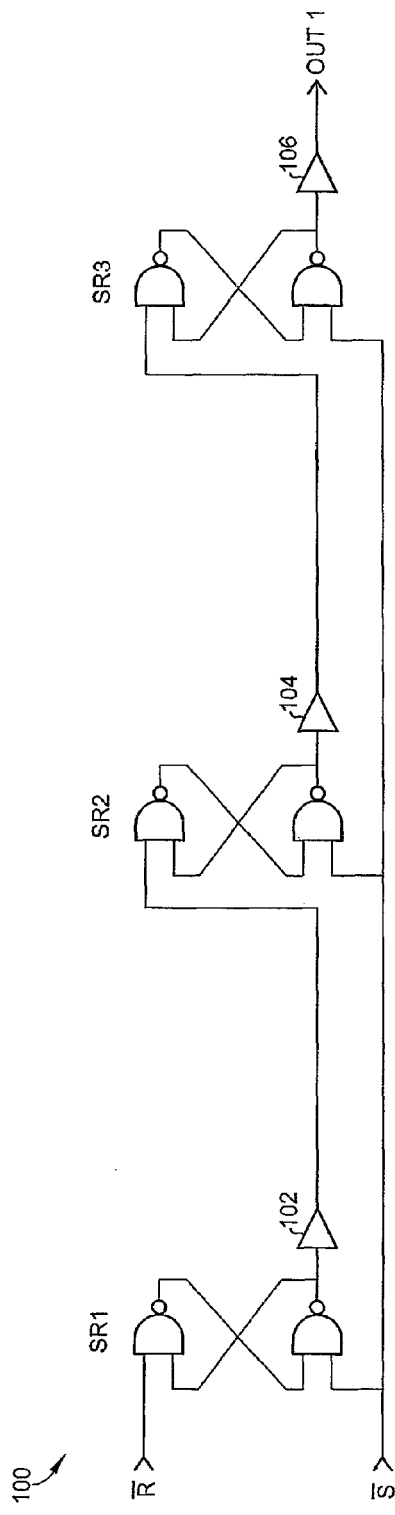
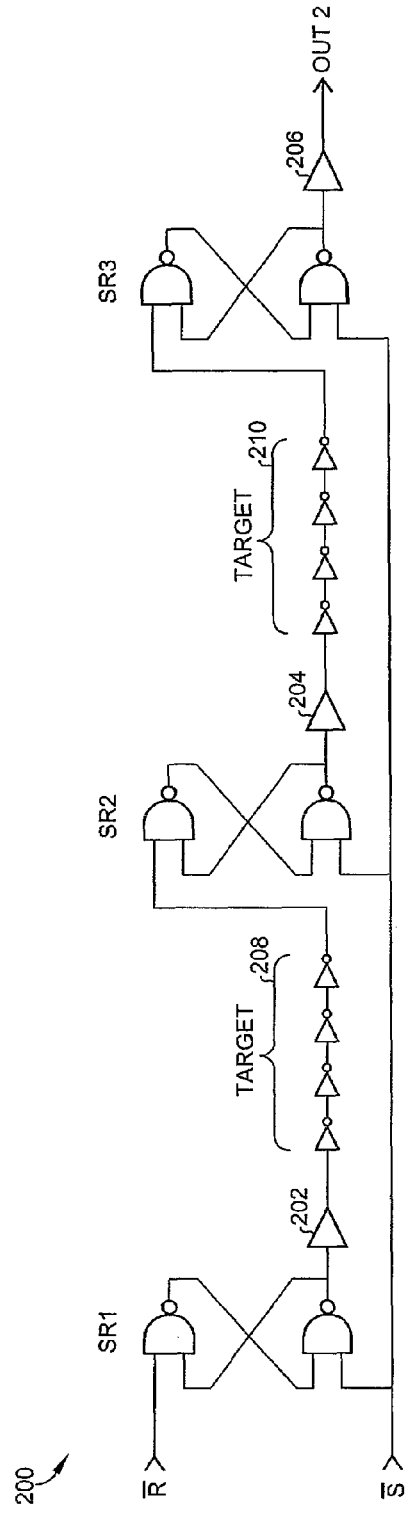
Fig. 1(a)
Fig. 1(b)

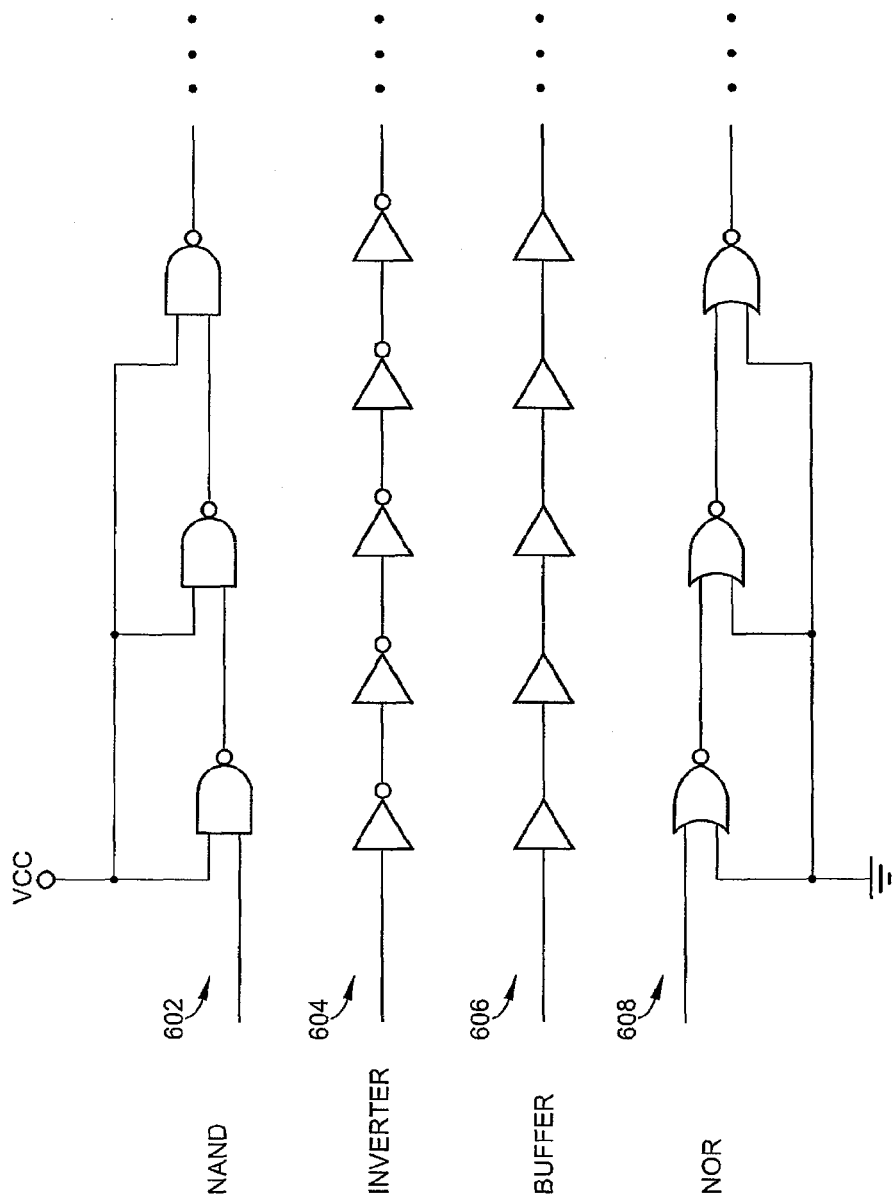

US 8,222,916 B2

SINGLE EVENT TRANSIENT DIRECT MEASUREMENT METHODOLOGY AND CIRCUIT

BACKGROUND OF THE INVENTION

1. Field of the Invention

This invention relates to a circuit and method of directly evaluating the single event transient SET performance of logic circuits.

2. Discussion of the Related Art

A previous methodology for evaluating SET performance of a logic circuit requires that two chains of SR latches 100 and 200 be built as shown respectively in FIGS. 1(a) and 1(b). The SET characteristic of chain 100 in FIG. 1(a) is measured and referred to as "baseline SET". This is accomplished by irradiating measurement chain 100 and determining when the OUT1 output terminal has flipped data states. The baseline SET describes the SET performance of the chains of Set/Reset latches (SR1, SR2, SR3, . . . ) and buffer cells (102, 104, 106, . . . ) in between each of the stages. Typically, the number of stages (N) is large (for example 4096) to allow SET measurements to be done in a relatively short amount of time. The SET performance of the chain 200 in FIG. 1(b) is measured and described as "cumulative SET" because it contains both the SET performance of the "Target" (208, 210 . . . ) made out of a number of core cells (inverters) and the "baseline SET", which measures the performance of the SR latches SR1, SR2, SR3, . . . and buffer cells 202, 204, 206, . . . similar to those found in measurement chain 100. Again, the cumulative SET is determined by irradiating measurement chain 200 and determining when the OUT2 output terminal has flipped data states. As a result of these two measurements, two SET performance curves are produced, and a third curve deduced, as is shown in the graph of FIG. 2. In the existing implementation, the "intrinsic SET" performance of the target cell is obtained by subtracting the "baseline SET" from the "cumulative SET". Precise measurement is difficult to perform due to the reduced accuracy of measuring both the "baseline SET" and the "cumulative SET" curves.

What is desired is a circuit and method for directly measuring the SET performance of a target logic circuit.

BRIEF SUMMARY OF THE INVENTION

A method of directly measuring SET immunity includes providing a target coupled to a measurement chain including a parallel pair of SR latches, irradiating the target, and allowing a pulse signal caused by an SET to propagate through the measurement chain only if the pair of SR latches are active at the same time. The pulse signal is latched thus allowing the presence of an SET event to be detected.

In a first embodiment according to the present invention, an SET measurement circuit includes a first measurement cell, which in turn includes a first SR latch coupled to a set input and a reset input, a second SR latch coupled to the set input and the reset input, a dual-input inverter having a first input coupled to an output of the first SR latch, a second input coupled to an output of the second SR latch and an output, and a target having an input coupled to the output of the dual-input inverter and an output. Subsequent serially coupled measurement cells each include a first SR latch coupled to a set input and an output of a previous cell, a second SR latch coupled to the set input and the output of the previous cell, a dual-input inverter having a first input coupled to an output of the first SR latch, a second input coupled to an output of the second SR latch and an output, and a target having an input coupled to the output of the dual-input inverter and an output forming the output of the cell. The SET performance of the total measurement chain can be measured at the output of either SR latch in the final measurement cell.

In a second embodiment according to the present invention, an SET measurement circuit includes a first measurement cell, which in turn includes a first SR latch coupled to a set input and a reset input, a second SR latch coupled to the set input and the reset input, a first dual-input inverter having a first input coupled to an output of the first SR latch, a second input coupled to an output of the second SR latch, and an output, a plurality of targets having an input coupled to the output of the first dual-input inverter, and an output, and a plurality of second dual-input inverters each having a first input coupled to the output of a respective target, a second input for receiving an enable signal, and an output. Subsequent serially coupled measurement cells each include a first SR latch coupled to a set input and an output of a previous cell, a second SR latch coupled to the set input and the output of the previous cell, a first dual-input inverter having a first input coupled to an output of the first SR latch, a second input coupled to an output of the second SR latch, and an output, a plurality of targets having an input coupled to the output of the first dual-input inverter, and an output, and a plurality of second dual-input inverters each having a first input coupled to the output of a respective target, a second input for receiving an enable signal, and an output, the coupled outputs of the plurality of second dual-input inverters forming the output of the cell. The SET performance of the total measurement chain can be measured at the output of either SR latch in the final measurement cell.

BRIEF DESCRIPTION OF THE DRAWING FIGURES

The invention, together with its various features and advantages and other aspects, can be readily understood from the following more detailed description taken in conjunction with the accompanying drawing figures, in which:

FIGS. 1(a) and 1(b) are schematic diagrams of measurement chains for determining SET performance according to the prior art;

FIG. 6 is a schematic diagram of various logic targets suitable for use with the measurement chains of the present invention.

DETAILED DESCRIPTION

Figure 2:
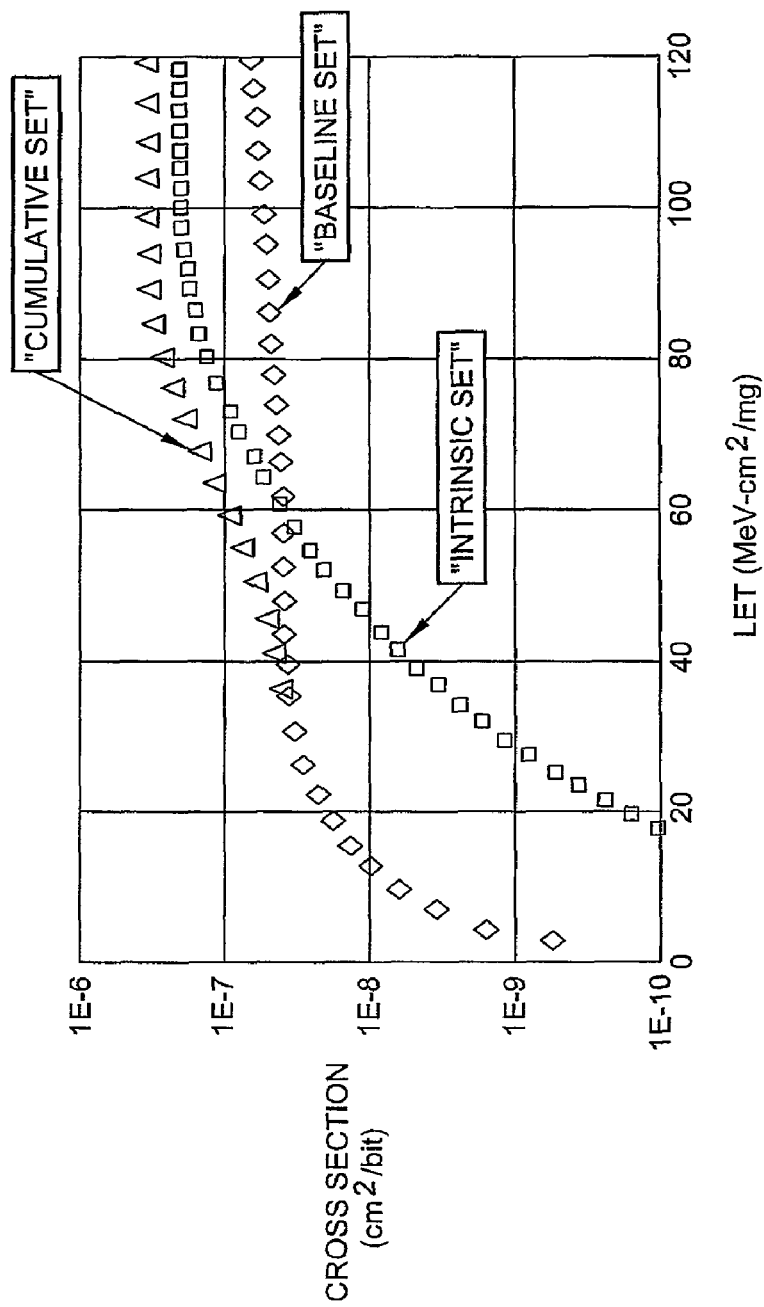
FIG. 2 is a graph showing baseline, cumulative, and intrinsic SET performance associated with the measurement chains of FIGS. 1(a) and 1(b)
Figure 3A:
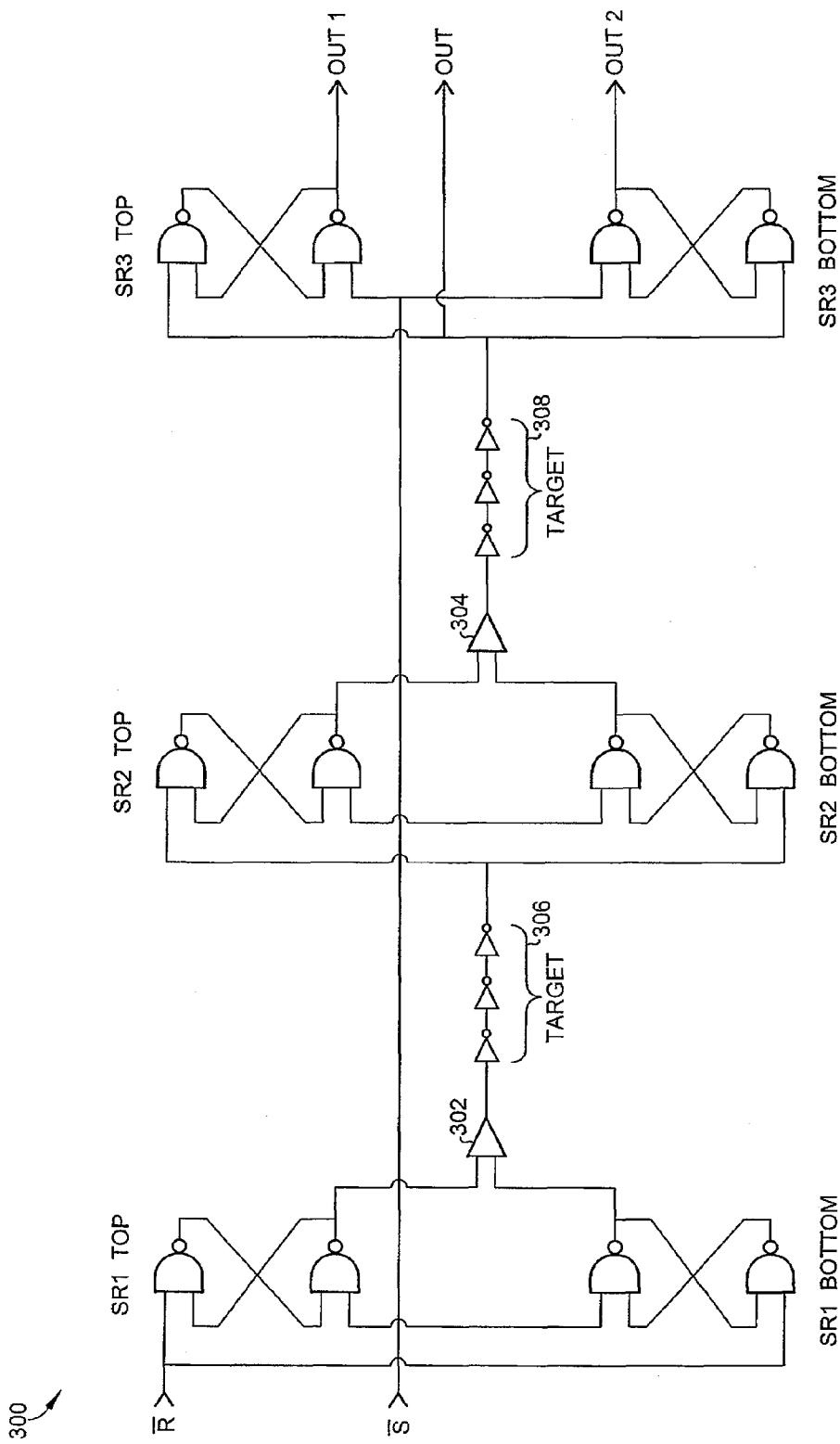
FIG. 3(a) is a schematic diagram of a first embodiment of a measurement chain for directly measuring SET performance, according to the present invention.

A first embodiment of a measurement chain 300 according to the present invention is shown in FIG. 3(a). While it maintains a superficial similarity to the initial structure of measurement chain 200 shown in FIG. 2 in the form of Set/Reset latches, by incorporating a dual-input inverter 302 (sometimes referred to as a "guard gated inverter") in the path of each Set/Reset stage, measurement chain 300 only allows propagation of a captured SET event when both SR latches SRNTOP and SRNBOTTOM are active at the same time. This process and the structure of measurement chain 300 according to the present invention are described in further detail below.

In the case of a SET event occurring in any of the target cells 306, 308, ..., both top and bottom Set/Reset latches SRNTOP and SRNBOTTOM will flip states, hence propagating the SET event at the output of the measurement chain 300 (signal OUT). The latched output of either SR latch in the last pair of such latches in the measurement chain will latch the pulse signal so that it can be measured effectively. In FIG. 3(a), this refers to latches SR3TOP and SR3BOTTOM, and the respective ERR1 and ERR2 latched output signals. The OUT signal propagates the SET pulse signal throughout measurement chain 300, but should not actually be used as an output node for measurement purposes as it will not capture an SET event that occurs in target cells 308. Only SR3TOP and SR3BOTTOM can effectively latch such an SET event. In the unlikely circumstance that the SET event is caused by either the top or bottom of the Set/Reset latch pair in any measurement chain cell, then the guard gate inverter 302, 304, ... will stay at a high impedance, hence not propagating the SET event pulse at the output of the measurement chain 300. The measurement chain 300 and method of operation therefore allows direct extraction of the "intrinsic SET" curve that was shown in FIG. 2. Measurement accuracy is increased and measurement time is decreased since the data can be extracted directly from circuit 300, and multiple measurements of different circuits are not required.

Referring again to FIG. 3(a) a first measurement cell of an SET measurement chain includes a first SR latch SR1TOP coupled to a set input /S and a reset input /R, a second SR latch SR1BOTTOM coupled to the set input /S and the reset input a, a dual-input inverter 302 having a first input coupled to an output of the first SR latch SR1TOP, a second input coupled to an output of the second SR latch SR1BOTTOM, and an output, and a target 306 having an input coupled to the output of the dual-input inverter 302, and an output driving the reset pin of the subsequent measurement cell.

Figure 3B:
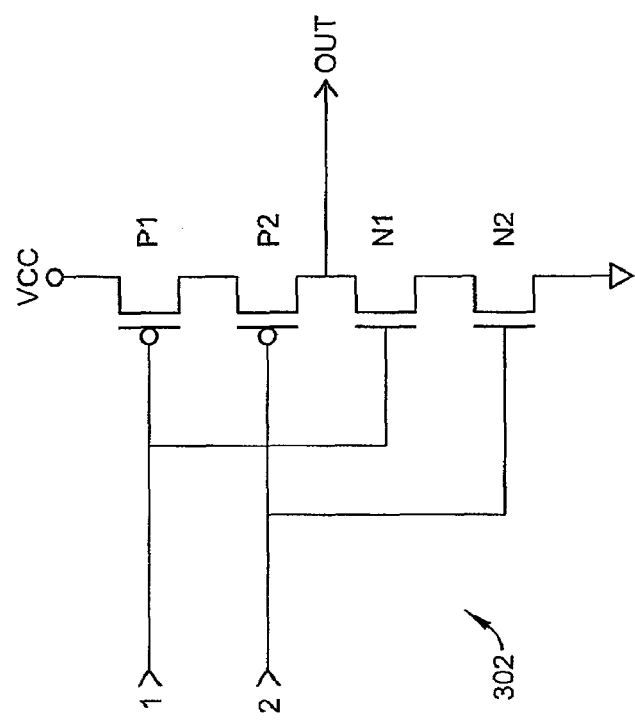
FIG. 3(b) is a schematic diagram of a dual-input inverter used in the measurement chain of FIG. 3(a)

The dual-input inverter 302 is shown in further detail in FIG. 3(b) and includes a first P-channel transistor P1 having a gate coupled to the first input 1, a second P-channel transistor P2 having a gate coupled to the second input 2, a first N-channel transistor N1 having a gate coupled to the first input 1, and a second N-channel transistor N2 having a gate coupled to the second input 2. The current paths of transistors P1, P2, N1, and N2 are serially coupled together between VCC and ground. The output of inverter 302 is taken between transistors P2 and N1. Persons skilled in the art will realize that inverter 302 is a type of logic circuit, and other transistor or logic circuits can be used to provide the logic function provided by inverter 302.

Figure 4:
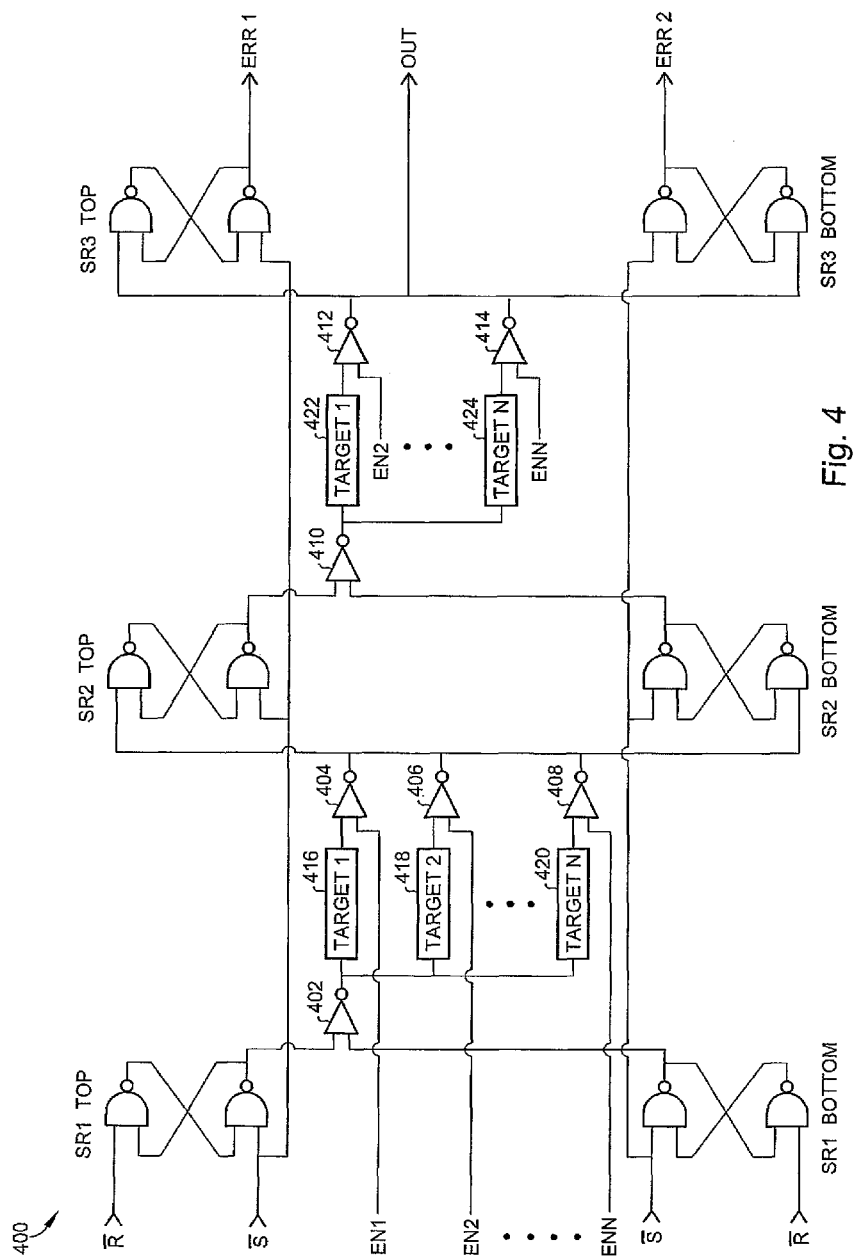
FIG. 4 is a schematic diagram of a second embodiment of a measurement chain for directly measuring SET performance, according to the present invention.

The target 306 in FIG. 3(a) is shown as a series of three inverters. Any odd number of inverters can be used. Testing time can be reduced if the number of targets, and individual gates or circuits within each target is increased. This increases the size of the test chip, however. A second embodiment of the invention will be discussed below with respect to FIG. 4 to address this issue. While a target comprising inverters is shown in FIG. 3(a), it will be apparent to those skilled in the art that other target circuits can be used, because numerous and varied integrated circuits are required to be tested for SET performance for use in space applications. The target circuit can comprise any logic circuit found in a design library such as a NAND gate, an inverter, a buffer, or other such logic circuits. Examples of these circuits are shown and described in greater detail in FIG. 6.

Subsequent measurement cells are serially coupled to the first measurement cell. Any number can be used, but two additional cells are shown in FIG. 3(a). An intermediate measurement cell in the measurement chain 300 includes a first SR latch SR2TOP coupled to a set input /S and an output of a previous cell (which is the output of the last inverter in target 306 in FIG. 3(a)), a second SR latch SR2BOTTOM coupled to the set input /S and the output of the previous cell, a dual-input inverter 304 having a first input coupled to an output of the first SR latch SR2TOP, a second input coupled to an output of the second SR latch SR2BOTTOM, and an output, and a target 308 having an input coupled to the output of the dual-input inverter 304, and an output forming the output of the cell. The dual-input inverter 304 is the same as was described with reference to dual-input inverter 302. The target 308 can include an odd number of NAND gates, inverters, buffers, or other library logic circuits as described above.

Finally, the last measurement cell in the measurement chain 300 includes SR latches SR3TOP and SR3BOTTOM. The actual latched output of the measurement chain 300 can be taken at the output of either latch, which are the ERR1 and ERR2 signals. These signals will latch if a pulse is created in any of the targets in the chain due to an SET event.

While the measurement circuit 300 shown in FIG. 3(a) can make direct measurements of SET performance, it can only be used to measure the performance of one type of target. Multiple such circuits as shown in FIG. 3(a) would be necessary to measure the performance of multiple targets, and this would require a large area on an integrated circuit test chip. A variation of the circuit previously described is measurement chain 400 shown in FIG. 4. Measurement chain 400 allows for a multitude of targets to use the same chain of Set/Reset latches, hence saving integrated circuit test chip area. To measure the SET performance of Target #1, the EN1 enable signal is set "High" while all of the other enable signals are kept "Low". Similarly, to measure the SET performance of Target #2, the EN2 enable signal is set "High" while all of the other enable signals are kept "Low". The structure of measurement chain 400 is now described in further detail below.

A first measurement cell of measurement chain 400 includes a first SR latch SR1TOP coupled to a set input /S and a reset input /R, a second SR latch SR1BOTTOM coupled to the set input and the reset input, a first dual-input inverter 402 having a first input coupled to an output of the first SR latch, a second input coupled to an output of the second SR latch, and an output, a plurality of targets 416, 418, 420, ... having an input coupled to the output of the first dual-input inverter 402, and an output, and a plurality of second dual-input inverters 404, 406, 408, ... each having a first input coupled to the output of a respective target, a second input for receiving an enable signal EN1, EN2, ENN, and an output. The outputs of dual-input inverters 404, 406, and 408 are coupled together to form the output of the first measurement cell. Each of the guard gate inverters 402, 404, 406, and 408 are the same as or logically equivalent to dual-input inverter 302, previously described. Targets 416, 418, and 420 can be formed using different logic circuits. For example, target 416 could be serially coupled NAND gates, target 418 could be serially coupled inverters, and target 420 could be serially coupled buffers. Alternatively, the targets could all be the same type of logic gate, but each having a different size to evaluate different SET immunity. Unlike the previous target cells 306 and 308, targets 416, 418, 420, 422, and 424 will comprise an even number of inverting stages.

An intermediate measurement cell in measurement chain 400 includes a first SR latch SR2TOP coupled to a set input /S and an output of a previous cell (outputs of guard gate inverters 404, 406, and 408), a second SR latch SR2BOTTOM coupled to the set input and the output of the previous cell, a first dual-input inverter 410 having a first input coupled to an output of the first SR latch, a second input coupled to an output of the second SR latch, and an output, a plurality of targets 422 through 424 having an input coupled to the output of the first dual-input inverter 410, and an output, and a plurality of second dual-input inverters 412 through 414 each having a first input coupled to the output of a respective target 422 through 424, a second input for receiving an enable signal EN1 through ENN, and an output, the coupled outputs of the plurality of second dual-input inverters 412 through 414 forming the output of the cell. All of the dual-input inverters in the intermediate measurement cell can be the same or logically equivalent to dual-input inverter 302 previously described. Generally speaking, the same target structure used in the first measurement cell will carry over to all of the intermediate measurement cells.

Figure 5:
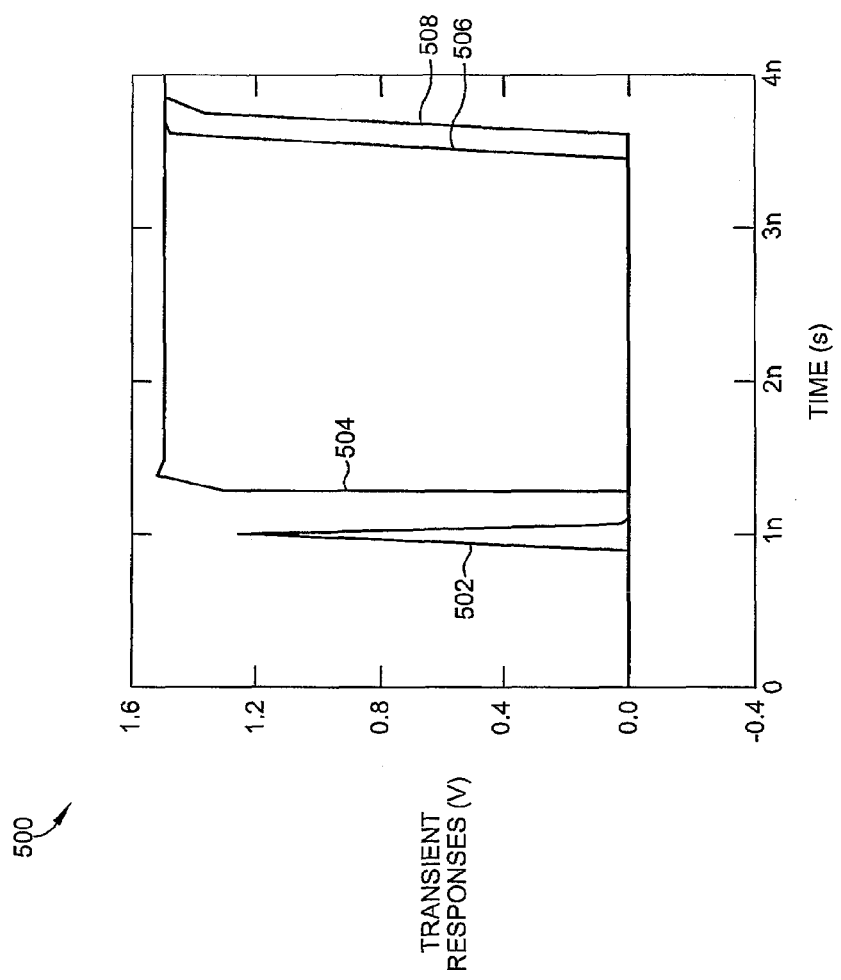
FIG. 5 is a timing diagram showing an SET pulse, followed by a latched edge according to the method of the present invention.

Referring now to the timing diagram 500 of FIG. 5, a spiked pulse signal due to an SET event involving a target is shown as pulse 502. An output of one of the SR latches at an intermediate measurement cell is shown as step 504. A further intermediate measurement cell output signal is shown as step 506. A final stage measurement cell SR latch output signal is shown as step 508.

Referring now to FIG. 6, simplified schematics are shown for a NAND target circuit 602, an inverter target circuit 604, a buffer target circuit 606, and a NOR target circuit 608. The inverter and buffer target circuits 604 and 606 are serially coupled circuits of individual inverters and buffers. The NAND target circuit 602 is a serially coupled circuit in which the output of a previous NAND gate is coupled to a first input of a subsequent NAND gate. All of the second inputs of the NAND gates are coupled to VCC so that the signal can propagate through the chain. Similarly, the NOR target circuit 608 is a serially coupled circuit in which the output of a previous NOR gate is coupled to a first input of a subsequent NOR gate. All of the second inputs of the NOR gates are coupled to ground so that the signal can propagate through the chain.

Thus, a circuit and method of measuring SET immunity has been shown including providing a target coupled to a measurement chain including a parallel pair of SR latches, irradiating the target, and allowing a pulse signal caused by an SET to propagate through the measurement chain only if the pair of SR latches are active at the same time. The pulse signal is captured by subsequent measurement cells, and finally detected at the output of one of the SR latches in a last measurement cell in the chain.

It is to be understood that the above-described circuits, embodiments, and drawing figures are merely illustrative of the many possible specific embodiments that can be devised to represent applications of the principles of the present invention. Numerous and varied other arrangements can be devised in accordance with these principles by those skilled in the art without departing from the spirit and scope of the invention. For example, the exact testing protocol involving number of targets, type of target, number of gates within each target, irradiation energy, irradiation times, and other testing details may be obviously changed to accommodate any type of circuit that is desired to be tested.

We claim:

1. A Single Event Transient (SET) measurement circuit comprising:
    a first SR latch coupled to a set input and a reset input;
    a second SR latch coupled to the set input and the reset input;
    a dual-input inverter having a first input coupled to an output of the first SR latch, a second input coupled to an output of the second SR latch, and an output; and
    a target having an input coupled to the output of the dual-input inverter, and an output;
    wherein the dual-input inverter comprises: a first P-channel transistor having a gate coupled to the first input; a second P-channel transistor having a gate coupled to the second input; a first N-channel transistor having a gate coupled to the first input; and a second N-channel transistor having a gate coupled to the second input.

2. The circuit of claim 1 wherein the target comprises a NAND gate.

3. The circuit of claim 1 wherein the target comprises an inverter.

4. The circuit of claim 1 wherein the target comprises a buffer.

5. A Single Event Transient (SET) measurement circuit comprising a plurality of serially coupled measurement cells, each cell comprising:
    a first SR latch coupled to a set input and an output of a previous cell;
    a second SR latch coupled to the set input and the output of the previous cell;
    a dual-input inverter having a first input coupled to an output of the first SR latch, a second input coupled to an output of the second SR latch, and an output; and
    a target having an input coupled to the output of the dual-input inverter, and an output forming the output of the cell;
    wherein the dual-input inverter comprises: a first P-channel transistor having a gate coupled to the first input; a second P-channel transistor having a gate coupled to the second input; a first N-channel transistor having a gate coupled to the first input; and a second N-channel transistor having a gate coupled to the second input.

6. The circuit of claim 5 wherein the target comprises a NAND gate.

7. The circuit of claim 5 wherein the target comprises an inverter.

8. The circuit of claim 5 wherein the target comprises a buffer.

9. A Single Event Transient (SET) measurement circuit comprising:
    a first SR latch coupled to a set input and a reset input;
    a second SR latch coupled to the set input and the reset input;
    a first dual-input inverter having a first input coupled to an output of the first SR latch, a second input coupled to an output of the second SR latch, and an output;
    a plurality of targets having an input coupled to the output of the first dual-input inverter, and an output; and
    a plurality of second dual-input inverters each having a first input coupled to the output of a respective target, a second input for receiving an enable signal, and an output;
    wherein at least one of the dual-input inverters comprises: a first P-channel transistor having a gate coupled to the first input; a second P-channel transistor having a gate coupled to the second input; a first N-channel transistor having a gate coupled to the first input; and a second N-channel transistor having a gate coupled to the second input.

10. The circuit of claim 9 wherein at least one target comprises a NAND gate.

11. The circuit of claim 9 wherein at least one target comprises an inverter.

12. The circuit of claim 9 wherein at least one target comprises a buffer.

13. A Single Event Transient (SET) measurement circuit comprising a plurality of serially coupled measurement cells, each cell comprising:
- a first SR latch coupled to a set input and an output of a previous cell;
- a second SR latch coupled to the set input and the output of the previous cell;
- a first dual-input inverter having a first input coupled to an output of the first SR latch, a second input coupled to an output of the second SR latch, and an output;
- a plurality of targets having an input coupled to the output of the first dual-input inverter, and an output; and
- a plurality of second dual-input inverters each having a first input coupled to the output of a respective target, a second input for receiving an enable signal, and an output, the coupled outputs of the plurality of second dual-input inverters forming the output of the cell;
- wherein at least one of the dual-input inverters comprises: a first P-channel transistor having a gate coupled to the first input; a second P-channel transistor having a gate coupled to the second input; a first N-channel transistor having a gate coupled to the first input; and a second N-channel transistor having a gate coupled to the second input.

14. The circuit of claim 13 wherein at least one of the targets comprises a NAND gate.

15. The circuit of claim 13 wherein at least one of the targets comprises an inverter.

16. The circuit of claim 13 wherein at least one of the targets comprises a buffer.

* * * * *